(12) United States Patent
Harris et al.

(10) Patent No.: US 7,342,433 B2
(45) Date of Patent: Mar. 11, 2008

(54) APPARATUS AND METHOD FOR ENHANCED TRANSIENT BLOCKING

(75) Inventors: Richard A. Harris, Palo Alto, CA (US); Francois Hebert, San Mateo, CA (US)

(73) Assignee: FulTec Semiconductor, Inc., Mountain View, CA (US)

( * ) Notice: Subject to any disclaimer, the term of this patent is extended or adjusted under 35 U.S.C. 154(b) by 0 days.

(21) Appl. No.: 11/270,062

(22) Filed: Nov. 8, 2005

(65) Prior Publication Data

US 2006/0098364 A1  May 11, 2006

Related U.S. Application Data

(60) Provisional application No. 60/626,372, filed on Nov. 9, 2004, provisional application No. 60/626,375, filed on Nov. 9, 2004.

(51) Int. Cl.
*H03K 17/687* (2006.01)
(52) U.S. Cl. .......................... 327/427; 361/56
(58) Field of Classification Search ............... 327/427; 361/56, 58, 111, 118
See application file for complete search history.

(56) References Cited

U.S. PATENT DOCUMENTS

| | | | |
|---|---|---|---|
| 3,916,220 A | 10/1975 | Roveti | 307/251 |
| 4,533,970 A | 8/1985 | Brown | 361/58 |
| 4,623,910 A | 11/1986 | Risberg | |
| 5,130,262 A | 7/1992 | Masquelier et al. | 437/31 |
| 5,319,515 A | 6/1994 | Pryor et al. | 361/93 |
| 5,625,519 A | 4/1997 | Atkins | 361/93 |
| 5,675,289 A * | 10/1997 | Schrittesser | 330/253 |
| 5,696,659 A | 12/1997 | Maruo | 361/93 |
| 5,729,418 A | 3/1998 | Lei | 361/58 |
| 5,742,463 A | 4/1998 | Harris | 361/88 |
| 5,789,900 A | 8/1998 | Hasegawa et al. | 320/132 |
| 5,815,356 A | 9/1998 | Rodriquez | |
| 5,929,665 A | 7/1999 | Ichikawa et al. | 327/109 |
| 6,002,566 A | 12/1999 | Arikawa et al. | 361/93.1 |
| 6,118,641 A | 9/2000 | Atkins et al. | 361/18 |
| 6,157,529 A | 12/2000 | Ahuja | 361/111 |
| 6,201,427 B1 | 3/2001 | Osborn | |

(Continued)

FOREIGN PATENT DOCUMENTS

| | | |
|---|---|---|
| AU | A-75035/91 | 11/1991 |
| DE | 3805811 | 9/1988 |
| DE | 4022253 | 1/1992 |
| DE | 4402461 | 8/1995 |
| DE | 4494617 | 11/1996 |

(Continued)

*Primary Examiner*—Quan Tra
(74) *Attorney, Agent, or Firm*—Lumen Patent Law Firm, Inc.

(57) ABSTRACT

An apparatus and method for enhanced transient blocking employing a transient blocking unit (TBU) that uses at least one depletion mode n-channel device interconnected with at least one depletion mode p-channel device. The interconnection is performed such that a transient alters a bias voltage $V_p$ of the p-channel device and a bias voltage $V_n$ of the n-channel device such that the p- and n-channel devices mutually switch off to block the transient. The apparatus has an enhancer circuit for applying an enhancement bias to a gate terminal of at least one of the depletion mode n-channel devices of the TBU to reduce a total resistance $R_{tot}$ of the apparatus. Alternatively, the apparatus has an enhancement mode NMOS transistor and a TBU connected thereto to help provide an enhancement bias to a gate terminal of the enhancement mode NMOS.

2 Claims, 4 Drawing Sheets

U.S. PATENT DOCUMENTS

| | | | |
|---|---|---|---|
| 6,313,610 B1 | 11/2001 | Korsunsky | 320/134 |
| 6,331,763 B1 | 12/2001 | Thomas et al. | 320/136 |
| 6,351,360 B1 | 2/2002 | Kotowski et al. | 361/103 |
| 6,518,731 B2 | 2/2003 | Thomas et al. | 320/136 |
| 6,714,393 B2 | 3/2004 | Nostrand | 361/58 |
| 6,768,623 B1 | 7/2004 | Shen | 361/93.9 |
| 6,855,988 B2 | 2/2005 | Madurawe | 257/347 |
| 6,861,828 B2 | 3/2005 | Watanabe | 323/282 |
| 6,865,063 B2 | 3/2005 | Ball | 361/93.9 |
| 6,914,416 B2 | 7/2005 | Thomas et al. | 320/136 |
| 6,948,078 B2 | 9/2005 | Odaohhara | 713/300 |
| 6,958,591 B1 | 10/2005 | Smith | 320/163 |
| 6,970,337 B2 | 11/2005 | Strahm | 361/58 |
| 2005/0128669 A1* | 6/2005 | Harris | 361/91.1 |

FOREIGN PATENT DOCUMENTS

| | | |
|---|---|---|
| EP | 0818867 | 1/1998 |
| EP | DE 0862255 | 2/1998 |
| GB | 2294598 | 1/1995 |
| JP | 1991053613 | 7/1991 |
| WO | WO9501667 | 1/1995 |
| WO | WO0101539 | 1/2001 |
| WO | WO03069753 | 8/2003 |
| WO | WO2004006408 | 1/2004 |
| WO | WO2004034544 | 4/2004 |

* cited by examiner

APPARATUS AND METHOD FOR ENHANCED TRANSIENT BLOCKING

RELATED APPLICATIONS

The present application claims the priority from provisional U.S. applications 60/626,372; 60/626,375 that were co-filed on 9 Nov. 2004 and are herein incorporated in their entirety.

FIELD OF THE INVENTION

This invention relates generally to apparatus and methods that employ a transient blocking unit (TBU) in conjunction with an enhancement arrangement to improve performance by reducing resistance and raising current handling capabilities.

BACKGROUND ART

Many circuits, networks, electrical devices and data handling systems are operated in configurations and environments where external factors can impair their performance, cause failure or even result in permanent damage. Among the most common of these factors are over-voltage and over-current. Protection against these factors is important and has been addressed in the prior art in a number of ways, depending on the specific electronics and their application.

Fuses that employ thermal or magnetic elements are one common protection measure. In other cases, protection circuits are available. Some examples are described in U.S. Pat. Nos. 5,130,262; 5,625,519; 6,157,529; 6,828,842 and 6,898,060. Protection circuits are further specialized depending on conditions and application. For example, in the case of protecting batteries or rechargeable elements from overcharging and over-discharging one can refer to circuit solutions described in U.S. Pat. Nos. 5,789,900; 6,313,610; 6,331,763; 6,518,731; 6,914,416; 6,948,078; 6,958,591 and U.S. Published Application 2001/00210192. Still other protection circuits, e.g., ones associated with power converters for IC circuits and devices that need to control device parameters and electric parameters simultaneously also use these elements. Examples can be found in U.S. Pat. Nos. 5,929,665; 6,768,623; 6,855,988; 6,861,828.

When providing protection for very sensitive circuits, such as those encountered in telecommunications the performance parameters of the fuses and protection circuits are frequently insufficient. A prior art solution embodied by transient blocking units (TBUs) that satisfy a number of the constraints is taught in international publications PCT/AU94/00358; PCT/AU04/00117; PCT/AU03/00175; PCT/AU03/00848 as well as U.S. Pat. Nos. 4,533,970; 5,742,463 and related literature cited in these references.

Unfortunately, when the trigger currents in TBUs are low their performance is limited. Specifically, the lower limit of TBU resistance is in the 8-10Ω range at trigger currents of 180 mA or less. A lower resistance is desirable in many applications mainly because of lower voltage drop, reduced power loss and higher system efficiency. Lower resistances are possible if either the trip current is increased or if the pinch-off voltage in traditional TBUs is reduced.

Unfortunately, this is not an option in many high-sensitivity applications.

OBJECTS AND ADVANTAGES

In view of the above prior art limitations, it is an object of the invention to provide an apparatus and method to permit transient blocking at low voltage drops and currents to reduce power loss and increase system efficiency. In particular, it is an object of the invention to reduce the total resistance of an apparatus that blocks transients.

It is another object of the invention to ensure that the apparatus is easy to make, low-cost and highly integrable, e.g., on the same die with a traditional transient blocking unit (TBU).

These and other objects and advantages of the invention will become apparent from the ensuing description.

SUMMARY OF THE INVENTION

The objects and advantages of the invention are addressed by an apparatus for enhanced transient blocking. The apparatus has a transient blocking unit (TBU) that uses at least one depletion mode n-channel device interconnected with at least one depletion mode p-channel device. The interconnection is performed such that a transient alters a bias voltage $V_p$ of the p-channel device and a bias voltage $V_n$ of the n-channel device in concert. Specifically, the bias voltages are altered such that the p-channel device and n-channel device mutually switch off to block the transient. The depletion mode n-channel device used by the TBU can be a junction-gate field effect transistor (JFET) or a metal-oxide-silicon field effect transistor (MOSFET). The apparatus has an enhancer circuit for applying an enhancement bias to a gate terminal of at least one of the depletion mode n-channel devices to reduce a total resistance $R_{tot}$ of the apparatus.

In one embodiment, the enhancer circuit comprises a gate charge enhancer. The gate charge enhancer can be connected to an external power source so that the enhancer circuit is powered independently of the TBU. Alternatively, the gate charge enhancer can be connected to the TBU only, such that it draws power through the TBU. In either case, the gate charge enhancer is connected to the TBU for applying the enhancement bias. In one specific embodiment, the gate charge enhancer also has a charge pump. In the same or another embodiment the enhancer circuit has a clamping circuit that may, for example, take advantage of a diode. Specifically, a voltage clamp can be used for limiting a gate-source voltage of the enhancement mode n-channel device of the TBU.

In still another embodiment of the apparatus of invention, an enhancement mode n-channel MOS (NMOS) transistor is connected to the TBU to reduce the total resistance $R_{tot}$. The TBU is connected to a gate terminal of the enhancement mode NMOS. In this embodiment there are two alternatives for powering the TBU. In one case, the TBU is connected to a drain terminal of the enhancement mode NMOS and thus they are commonly powered. In the other case, the transistor and the TBU are separately powered. A gate bias element can be connected to the gate terminal of the enhancement mode NMOS in either of these cases.

The apparatus can also be reconfigured so that the TBU is not directly connected to the gate terminal of the enhancement mode NMOS. In such embodiments, a gate bias device is connected both to the TBU and to the gate terminal of the of the enhancement mode NMOS. In these embodiments, the gate bias device can be equipped with a charge pump and a voltage clamp can be used for limiting a gate-source voltage $V_{gs}$ of the enhancement mode NMOS.

In embodiments using the enhancement mode NMOS the TBU can be connected to an external power source so that it is separately powered. Alternatively, the TBU is connected to a drain terminal of the enhancement mode NMOS and they are commonly powered.

In one method of invention, enhanced transient blocking is achieved by using the TBU and applying an enhancement bias to the gate terminal of the at least one depletion mode n-channel device of the TBU so as to reduce the total resistance $R_{tot}$. The enhancement bias can be applied by an enhancer circuit, which is either commonly or separately powered. In addition, the enhancer circuit can be clamped in some embodiments of the method.

In another method of invention, enhanced transient blocking is achieved by using the TBU connected to an enhancement mode NMOS transistor to reduce the total resistance $R_{tot}$. The enhancement mode NMOS and the TBU are either separately or commonly powered and the method can include clamping of the enhancement mode NMOS transistor.

A detailed description of the preferred embodiments of the invention is presented below in reference to the appended drawing figures.

DETAILED DESCRIPTION

Figure 1:
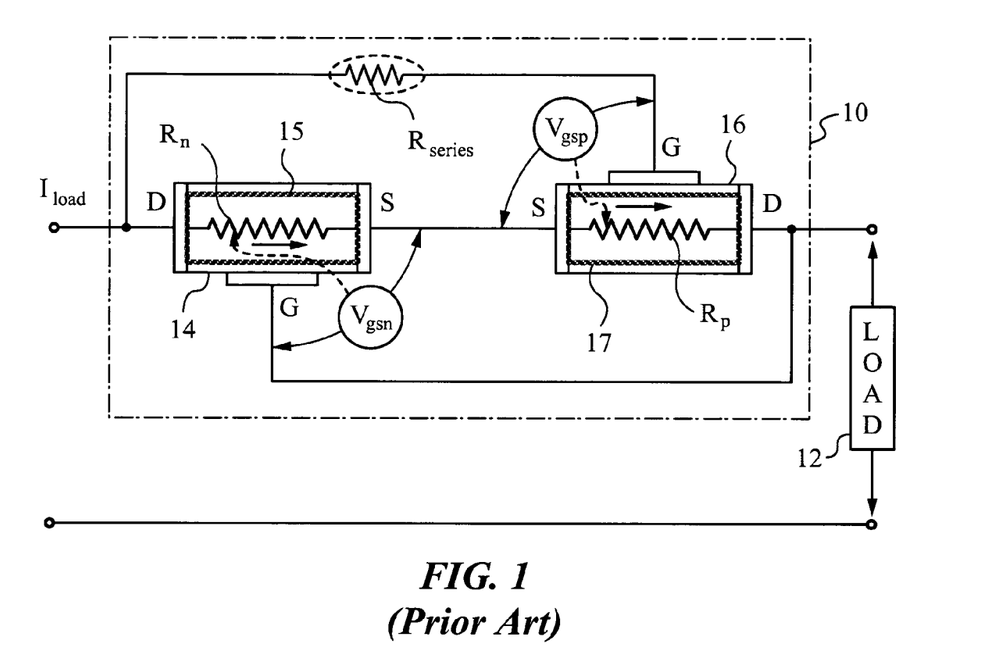
FIG. 1 is a diagram illustrating the basic principle of operation of a prior art uni-directional transient blocking unit (TBU).

The present invention and its principles will be best understood by first reviewing prior art uni-directional and bi-directional transient blocking units (TBUs) designed for over-voltage and over-current protection. The diagram in FIG. 1 shows a prior art TBU 10 for protecting a load 12 from voltage and/or current transients of one polarity, i.e., positive voltage spikes or surges. For this reason, TBU 10 is called unidirectional or uni-directional. TBU 10 uses a depletion mode n-channel device 14, typically an n-channel metal-oxide-silicon (NMOS) device implemented as a field effect transistor (FET). TBU 10 also uses a depletion mode p-channel device 16, typically a p-channel junction gate field effect-transistor (PJFET). It should be noted that PMOS, NJFET devices can also be used as devices 14, 16. In the example shown, both NMOS and PJFET 14, 16 are interconnected to take advantage of their n-channel and p-channel biasing and resistance properties to cause mutual switch off to block the transient.

More specifically, NMOS and PJFET 14, 16 have corresponding n- and p-channels 15, 17 as well as gate G, source S and drain D terminals. Resistances $R_n$, $R_p$ of NMOS and PJFET 14, 16 are low when voltage differences or bias voltages $V_{gsn}$ and $V_{gsp}$ between their gate G and source S terminals are zero. Normally, TBU 10 is unblocked and both NMOS and PJFET 14, 16 act as small resistors that allow a load current $I_{load}$ to pass to load 12. Application of negative bias $V_{gsn}$ to NMOS 14 and positive bias $V_{gsp}$ to PJFET 16 increases resistances $R_n$, $R_p$, as indicated by the arrows and turns NMOS and PJFET 14, 16 off. The interconnection of NMOS 14 with PJFET 16 source-to-source and gate-to-drain reinforces the biasing off process in response to a transient. Specifically, as load current $I_{load}$ increases PJFET 16 develops a larger voltage drop across it, thus increasing negative bias $V_{gsn}$ applied to NMOS 14 and consequently increasing resistance $R_n$. Higher resistance $R_n$ increases positive bias $V_{gsp}$ on PJFET 16 thereby increasing $R_p$. Thus, the transient alters bias voltages $V_{gsn}$ and $V_{gsp}$ in concert such that NMOS and PJFET 14, 16 mutually increase their resistances $R_n$, $R_p$ and switch off and thus TBU 10 blocks the transient.

Figure 2:
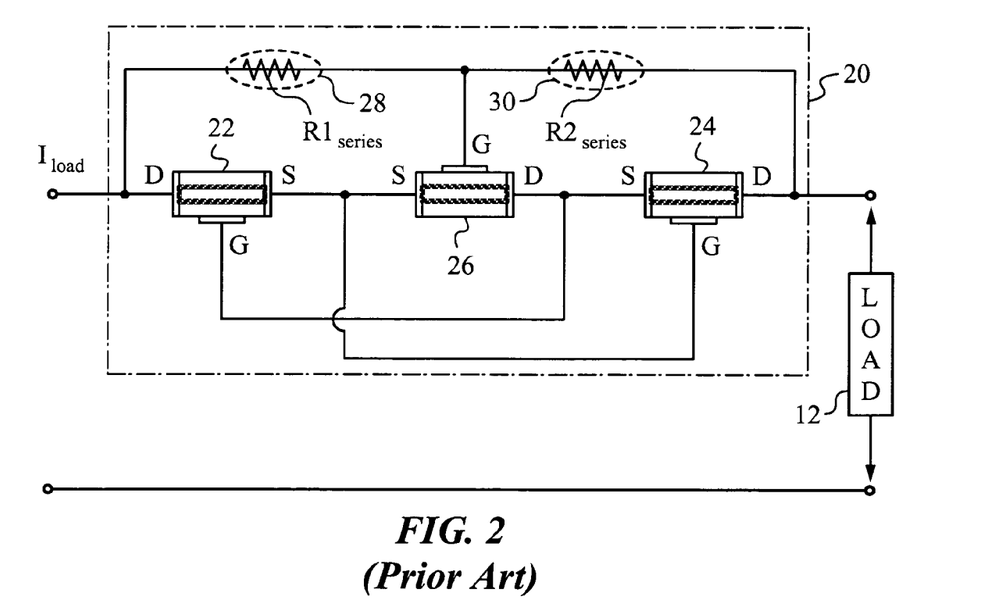
FIG. 2 is a diagram illustrating the basic principle of operation of a prior art bi-directional TBU.

The above principle of interconnection of n- and p-channel devices to achieve mutual switch off (sometimes also referred to as mutual pinch-off) is extended to bi-directional TBUs by using two uni-directional TBUs with one configured in reverse to block negative spikes. A simpler, bi-directional TBU 20 that protects load 12 from negative and positive spikes, is shown in FIG. 2. TBU 20 has two n-channel devices 22, 24 and one p-channel device 26. Devices 22, 24, 26 are interconnected between their gate G, source S and drain D terminals as shown. Two current limiters in the form of series resistors $R1_{series}$ and $R2_{series}$ are used to ensure appropriate routing of current between devices 22, 24, 26. It should be noted that current limiters 28, 30 can also be implemented by diodes, transistors, current sources or combinations thereof. TBU 20 causes mutual switch off of devices 22, 24, 26 in response to a negative or positive spike by employing the principles of controlling resistances by biasing in response to transients as explained above.

In fact, the prior art teaches a number of variants of TBUs based on the above principles. These include, among other, TBUs that use p-channel devices at inputs, a larger number of n-channel or p-channel devices as well as TBUs that employ high-voltage depletion devices. More detailed information about prior art TBUs and associated applications and methods can be found in published literature including, in particular, PCT/AU94/00358, PCT/AU04/00117; PCT/AU03/00175; PCT/AU03/00848 and U.S. Pat. No. 5,742, 463 that are herein incorporated by reference.

As indicated in the background section, it would be desirable to have a TBU that exhibits a low voltage drop to promote reduced power loss and increased system efficiency. The reason why the present TBU does not achieve this is best explained by referring once again to TBU 10 in FIG. 1. At low current $I_{load}$, the resistance of TBU 10 is lowest, since devices 14, 16 are fully on and so resistances $R_n$, $R_p$ as well as any series resistance $R_{series}$ added to adjust the trip or switch off point of TBU 10 are low. Specifically, total resistance $R_{tot}$ of TBU 10 is:

$$R_{tot}=R_n+R_p+R_{series}.$$

TBU 10 switches off when the voltage drop across PJFET 16 approaches the pinch-off voltage of NMOS 14. When using a state-of-art depletion mode NMOS 14, the pinch-off voltage $V_p \approx 1.5$ V. Thus, based on the typical hold current $I_{hold}$, resistance $R_p$ of PJFET 16 is on the order of:

$$R_p = \frac{\approx 1.5\ \text{V}}{I_{hold}} = \frac{\approx 1.5\ \text{V}}{0.18\ \text{A}} \approx 8\ \Omega.$$

Therefore, when configured for a trigger current of about 180 mA the lower limit of TBU 10 resistance $R_{tot}$ is in the 8-10Ω range. As remarked above, lower resistance $R_{tot}$ is desirable in many applications mainly because of lower voltage drop, reduced power loss and higher system efficiency. Lower resistances are possible if either the trip current is increased or if the pinch-off voltage $V_p$ of NMOS 14 is reduced. Unfortunately, this is not possible in many applications. The pinch-off voltage of NMOS 14 can be reduced just below 1 V at best. In addition, the resistance of NMOS 14 is heavily dependent on $V_p$, so there is a point of diminishing returns when the resistance increase in NMOS 14 out-paces the resistance decrease of PJFET 16.

Figure 3:
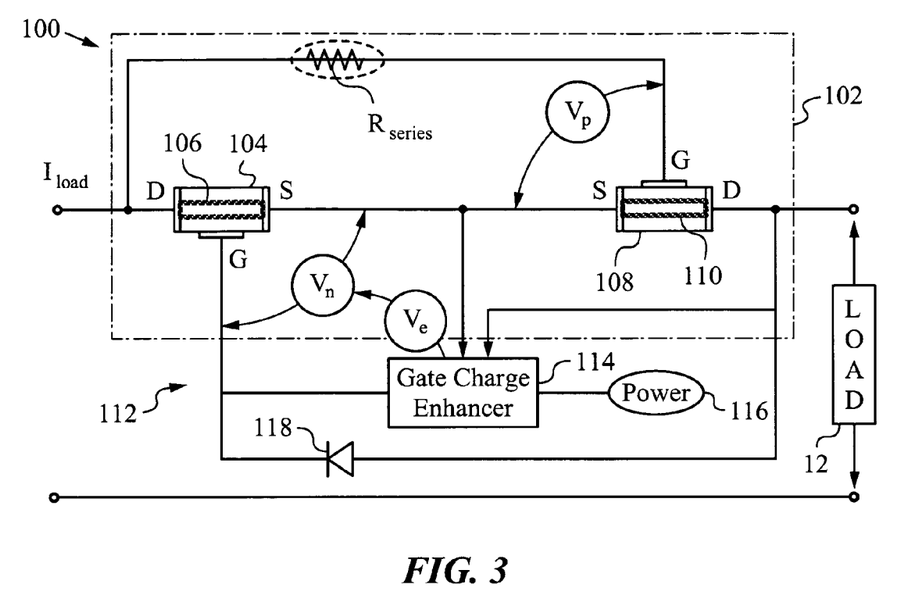
FIG. 3 is a diagram of an apparatus in accordance with the invention implemented with a uni-directional TBU.

In accordance with the invention, high total resistance $R_{tot}$ limitation of traditional TBUs is overcome by an apparatus 100 for enhanced transient blocking as shown in FIG. 3. Apparatus 100 is implemented with a uni-directional TBU 102 that has a depletion mode device 104 with an n-channel 106 interconnected with a depletion mode device 108 with a p-channel 110. The interconnection is performed source-to-source (S-S) and gate-to-drain (G-D) such that a transient alters a bias voltage $V_p$ of p-channel device 108 and a bias voltage $V_n$ of n-channel device 104 in concert. Specifically, bias voltages $V_p$, $V_n$ are altered such that p- and n-channel devices 108, 104 mutually switch off to block the transient. Depletion mode n-channel device 104 used by TBU 102 can be a junction-gate field effect transistor (JFET) or a metal-oxide-silicon field effect transistor (MOSFET). In the present embodiment, device 104 is a MOSFET.

Apparatus 100 has an enhancer circuit 112 for applying an enhancement bias $V_e$ to gate terminal G of MOSFET 104. Specifically, enhancer circuit 112 has a gate charge enhancer 114 that generates an enhancement bias $V_e$ with reference to the voltage at drain terminal D of p-channel device 108. To permit this, a first monitoring connection is made between gate charge enhancer 114 and drain terminal D of p-channel device 108. A second monitoring connection is made between source terminal S of p-channel device 108 and gate charge enhancer 114. Thus, gate charge enhancer 114 directly monitors the source-to-drain voltage drop and can determine what enhancement bias $V_e$ to apply to gate terminal G of MOSFET 104.

Thus, bias voltage $V_n$, which corresponds to the source-to-drain voltage drop of p-channel device 108 is initially present between the source and gate of MOSFET 104. Gate charge enhancer 114 enhances bias voltage $V_n$ by enhancement bias $V_e$, such that the actual bias voltage between the source and gate of MOSFET 104 is the sum of biases $V_n$-$V_e$. Since enhancement bias $V_e$ is a small negative voltage due to positive current drain-to-source of device 108, the sum of voltage $V_n$ and $V_e$ is positive and sufficiently large to significantly enhance the bias at gate terminal G of MOSFET 104, thereby reducing its normal on state resistance.

Enhancer circuit 112 has an external power source 116 connected to gate charge enhancer 114. Thus, enhancer circuit 112 is powered separately from TBU 102. Alternatively, gate charge enhancer 114 can be connected to TBU 102 after drain terminal D of p-channel device 108. In this configuration, charge enhancer 114 draws power from TBU 102. This alternative may not be suitable when gate charge enhancer 114 has significant power requirements for stable operation at low current levels and operation at such levels is required by the application of apparatus 100.

Enhancer circuit 112 also has a clamping circuit 118 that in the present embodiment is implemented by a single diode. Diode 118 is used for limiting or clamping the gate-source voltage or actual bias $V_n$-$V_e$ applied to MOSFET 104 below a maximum bias $V_{max}$.

During operation, uni-directional TBU 102 of apparatus 100 is driven to block positive surges by altering bias voltages $V_n$ and $V_p$ in concert such that devices 104, 108 mutually increase resistances $R_n$, $R_p$ of n- and p-channels 106, 110 and thus mutually switch off to block any transient. As described previously, enhancer circuit 112 enhances bias voltage $V_n$ by enhancement bias $V_e$ applied by gate charge enhancer 114. When this effect is continued during transient blocking operation, the negative bias $V_n$ would need to overcome a large positive enhancement bias $V_e$ to switch-off MOSFET 104. Therefore, when bias voltage $V_n$ exceeds a preset value as measured with the aid of gate charge enhancer 114 and its two monitoring connections, gate enhancement bias $V_e$ is removed by enhancer 114 and the negative bias $V_n$ is directly applied to gate terminal G of MOSFET 104 to begin biasing TBU 102 to switch-off at the set surge current.

Figure 4:
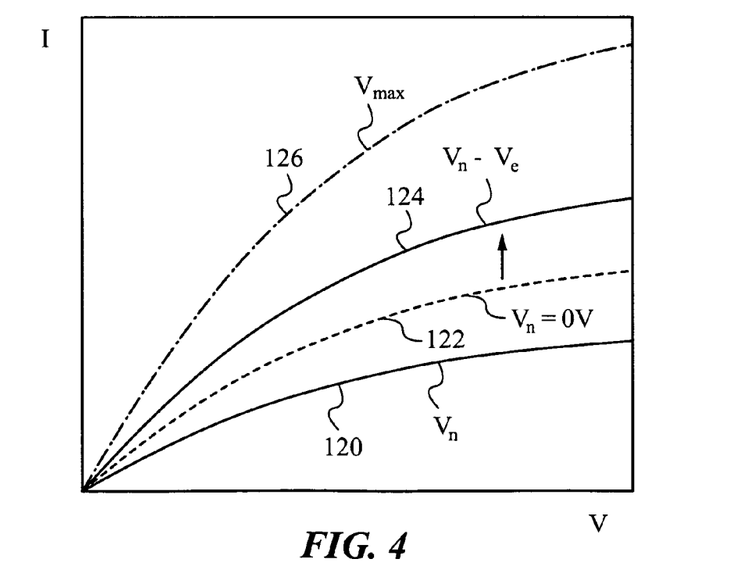
FIG. 4 is a graph illustrating the operation of the enhancer circuit of apparatus of FIG. 3.

The graph in FIG. 4 illustrates the operation of enhancer circuit 112 of apparatus 100 in more detail. In particular, an I-V curve 120 illustrates the current-voltage response of MOSFET 104 in a prior art TBU when only bias voltage $V_n$ is applied. In this case $V_n$ is less than zero because gate terminal G is necessarily connected to a lower potential than source terminal S. Therefore, the on-resistance of TBU 102 is relatively large, e.g., 8-10Ω. For reference, an I-V curve 122 illustrating the current-voltage response of MOSFET 104 at $V_n$=0V is indicated in a dashed line.

Now, when using enhancer circuit 112 in accordance with the invention, the actual bias voltage is $V_n$-$V_e$. $V_e$ is chosen to be sufficiently large to improve the current-voltage response of MOSFET 104 with respect to the condition when $V_n$=0V. In fact, an I-V curve 124 indicates the improved current-voltage response of MOSFET 104. In this manner, the on-resistance is reduced below the 8-10Ω range even at low current levels, e.g., below 180 mA, and the current handling capacity of TBU 102 is increased. As a result, total resistance $R_{tot}$ of apparatus 100 during normal operation is reduced because $R_n$ is lowered.

At the same time, diode 118 clamps actual bias voltage $V_n$-$V_e$ below maximum bias $V_{max}$ to prevent malfunction of MOSFET 104. An I-V curve 126 corresponding to the current-voltage response at $V_{max}$ is indicated in dashed and dotted line. In any particular application, maximum bias $V_{max}$ will depend on the maximum positive voltage that can be applied between gate terminal G and source terminal S of MOSFET 104. This is a function of gate oxide thickness. Preferably, $V_{max}$ should be set between ½ to ⅓ of the gate oxide breakdown voltage. When using a JFET instead of MOSFET 104, maximum bias $V_{max}$ should be set equal to the forward bias of the gate-source junction, which is a function of the bandgap of the material. For silicon (Si) this is approximately 0.6 V, but in any case less than 1 V. For silicon carbide (SiC) this is approximately 2 V.

It should be noted that enhancer circuit 112 and TBU 102 can be integrated on the same die. Because of the low total resistance $R_{tot}$ and its improved current handling capability, apparatus 100 satisfies the stringent requirements dictated by sensitive circuits, e.g., telecommunication circuits. In addition, apparatus 100 is simple in construction, requires few parts and is highly integrable.

Figure 5:
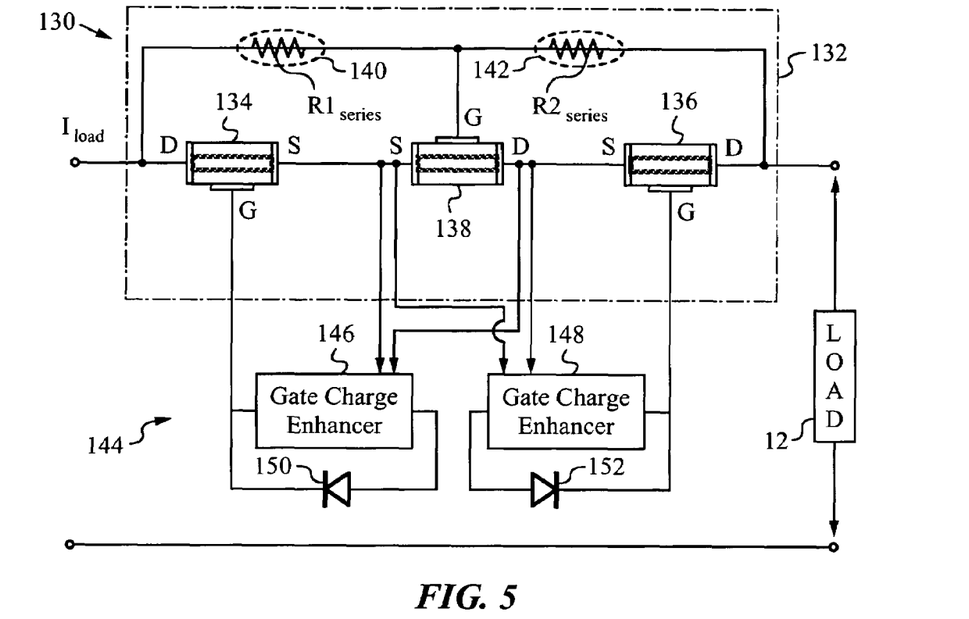
FIG. 5 is a diagram of another apparatus in accordance with the invention implemented with a bi-directional TBU.

FIG. 5 is a diagram of another apparatus 130 in accordance with the invention implemented with a bi-directional TBU 132. Bi-directional TBU 132 has two n-channel devices 134, 136 and one p-channel device 138 interconnected in the manner described above with reference to FIG. 2. In the present case, devices 134, 136 are MOSFETs. Two current limiters 140, 142 are used to ensure appropriate routing of current between devices 134, 136, 138. Current limiters 140, 142 can be diodes, resistors, transistors, current sources or combinations thereof. For the purpose of the present invention, they are represented as series resistances $R1_{series}$ and $R2_{series}$.

Apparatus 130 has an enhancer circuit 144 that has two gate charge enhancers 146, 148 for applying enhancement biases $V_{e1}$, $V_{e2}$ to gate terminals G of MOSFETs 134, 136, respectively. Thus, bias voltages $V_{n1}$, $V_{n2}$ between the source and gate terminals of MOSFETs 134, 136 are enhanced by enhancement biases $V_{e1}$, $V_{e2}$. To determine appropriate enhancement biases $V_{e1}$, $V_{e2}$ monitoring connections for measuring the source-to-drain voltage drop across p-channel device 138 are provided to each gate charge enhancer 146, 148 as shown. The actual bias voltages between the source and gate terminals of MOSFETs 134, 136 are the sums of biases $V_{n1}-V_{e1}$ and $V_{n2}-V_{e2}$, respectively. They are determined and applied as described above to achieve proper switch-off operation.

Enhancer circuit 144 does not have an external power source. Instead, both gate charge enhancers 146, 148 are connected to TBU 132 as shown to draw power from it. Of course, it is also possible to provide a single or two separate power sources to provide power to gate charge enhancers 146, 148.

Enhancer circuit 144 also has clamping circuits 150, 152 that in the present embodiment is implemented by diodes. Diodes 150, 152 are used for limiting or clamping the gate-source voltages or actual biases $V_{n1}-V_{e1}$ and $V_{n2}-V_{e2}$, applied to MOSFETs 134, 136 below maximum biases $V_{max1}$, $V_{max2}$. It should be noted that other types of clamping circuits can be used, even including TBUs.

During operation, TBU 132 is driven to block positive surges and negative surges by altering bias voltages $V_n$ and $V_p$ in concert such that devices 134, 136 and 138 mutually switch off to block a transient of either polarity, i.e., either a positive or negative over-voltage or over-current. Enhancer circuit 144 enhances bias voltages $V_{n1}$, $V_{n2}$ by enhancement biases $V_{e1}$, $V_{e2}$ applied by gate charge enhancers 146, 148. For completeness, it should be noted that since both $V_{n1}$, $V_{n2}$ are determined from the source-to-drain voltage drop across p-channel device 108, they will be measured to be equal, though at any particular instant the actual applied values may differ. Thus, the actual bias voltages between source and gate terminals of MOSFETs 134, 136 are equal to the sums of biases $V_{n1}-V_{e1}$ and $V_{n2}-V_{e2}$. At the same time, because of the clamping action of diodes 150, 152 the actual biases do not exceed maximum biases $V_{max1}$, $V_{max2}$ i.e., $V_{n1}-V_{e1} \leq V_{max1}$ $V_{n2}-V_{e2} \leq V_{max2}$. Typically, the maximum biases $V_{max1}$, $V_{max2}$ are equal, since typically MOSFETs 134, 136 are of the same type. As a result, the principles of operation of each gate charge enhancer 146, 148 is analogous to the operation of gate charge enhancer 114 of apparatus 100.

Once again, it should be noted that enhancer circuit 144 and TBU 132 can be integrated on the same die. Because of the low total resistance $R_{tot}$ and its improved current handling capability, apparatus 130 satisfies the stringent requirements dictated by sensitive circuits requiring bi-directional protection, e.g., telecommunication circuits. In addition, apparatus 130 is simple in construction, requires few parts and is highly integrable.

In either of the above embodiments, when using external power sources to separately power the gate charge enhancers or using common power from the TBU, the amount of bias voltage increase will be a function of the power source. When there is no external power source, then at zero voltage, i.e., no current flowing through the TBU, the gate charge enhancers will be off and there will be no enhancement. As the current flow and voltage drop in the TBU increase, the gate charge enhancers will be powered up and apply positive bias at the gate terminal of the NMOS. In contrast, when the gate charge enhancers are externally powered, they will be able to provide positive gate terminal bias to the NMOS at any current flow through the TBU, and hence reduce the TBUs total resistance $R_{tot}$.

Figure 6:
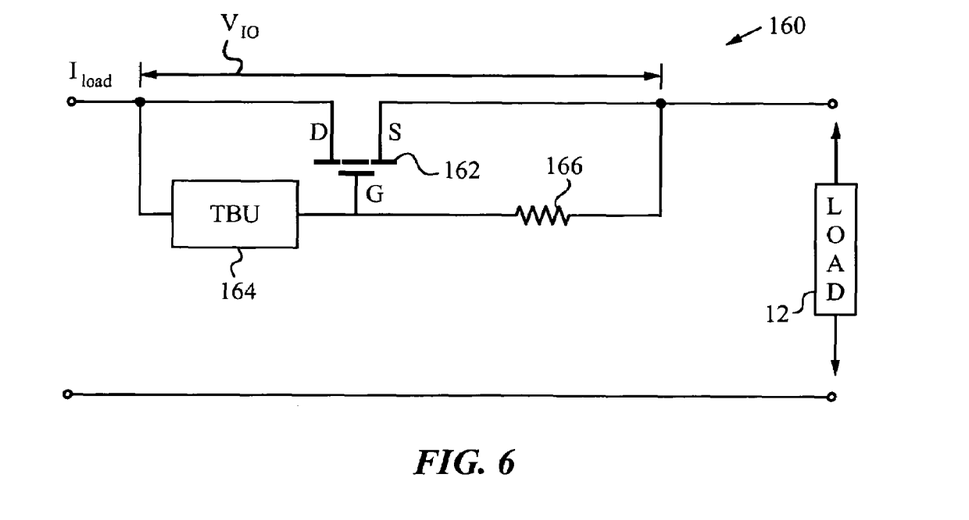
FIG. 6 is a diagram of an apparatus according to the invention employing an enhancement mode NMOS transistor in a commonly powered configuration.

FIG. 6 illustrates still another embodiment of an apparatus 160 according to the invention. Apparatus 160 employs an enhancement mode n-channel MOS (NMOS) transistor 162 connected to a low current TBU 164, which may be uni-directional or bi-directional to reduce the total resistance $R_{tot}$ of apparatus 160. In particular, TBU 164 is connected to gate terminal G and to drain terminal D of enhancement mode NMOS 162. NMOS 162 preferably has a large gate width to ensure that it has a low on-resistance.

Apparatus 160 has a gate bias element 166 in the form of a resistor. Element 166 is connected to gate terminal G of enhancement mode NMOS 162 and to its source terminal S. All connections are internal to the package of apparatus 160.

The operation of apparatus 160 takes advantage of the above-explained principle that the resistance of enhancement mode NMOS transistor 162 is lowered by increasing the gate-source bias $V_n$. In particular, low current TBU 164 feeds current to gate terminal G from drain terminal D of enhancement mode NMOS transistor 162. As a result, the actual bias applied to gate terminal G of NMOS 162 is increased, thus further decreasing the low resistance of NMOS 162. Note, that when TBU 164 is conducting the voltage drop across resistor 166 is sufficient to forward bias NMOS 162. When TBU 164 switches off, then the resistances pull gate of NMOS 162 to the voltage at source S and NMOS 162 turns off. The voltage drop $V_{IO}$ of apparatus 160 is equal to $V_n$ and the voltage across TBU 164.

Figure 7:
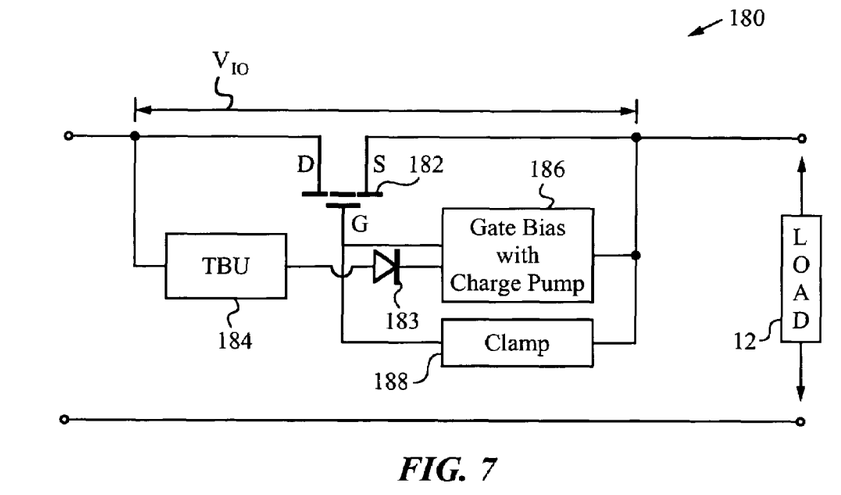
FIG. 7 is a diagram of an apparatus using an enhancement mode NMOS and a gate bias with charge pump in a commonly powered configuration.

FIG. 7 is a diagram of yet another apparatus 180 according to the invention employing an enhancement mode NMOS 182 with large gate width and low on-resistance. Apparatus 180 uses a low current TBU 184 connected to drain terminal D of NMOS 182 so that it is commonly powered with it. Apparatus 180 has a gate bias device 186 connected to gate terminal of enhancement mode NMOS 182 for increasing a gate bias $V_n$ applied to NMOS 182. A diode 183 is provided to ensure appropriate current flow between TBU 184 and gate bias device 186.

Device 186 contains a charge pump for increasing gate terminal drive to lower the channel resistance of NMOS 182.

Furthermore, apparatus 180 has a voltage clamp 188 for limiting or clamping bias $V_n$ below a maximum bias $V_{max}$.

During operation, as the voltage across TBU 184 increases, the power to charge pump 186 increases, thereby reducing the resistance of NMOS 182. Clamp 188 ensures that $V_n$ does not exceed $V_{max}$ so as to protect the gate oxide of NMOS 182. TBU 184 turns off charge pump 186 and NMOS 182 as the current and voltage reach their limit, as set by TBU 184. Thus, apparatus 180 achieves a low voltage drop $V_{IO}$ during operation and achieves efficient switch off as required for sensitive applications.

Figure 8:
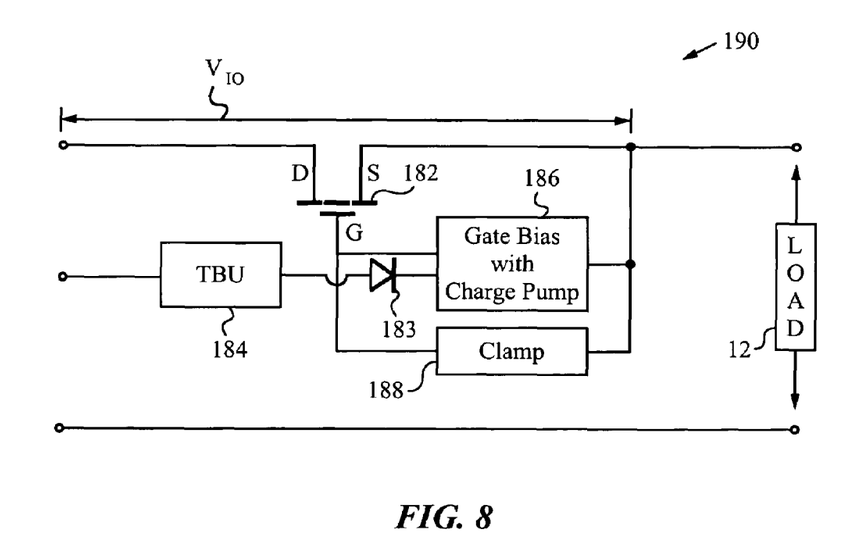
FIG. 8 is a diagram of an apparatus using an enhancement mode NMOS and a gate bias with charge pump in a separately powered configuration.

FIG. 8 is a diagram of an apparatus 190 similar to apparatus 180 and corresponding elements are designated by the same reference numerals. In contrast to apparatus 180, TBU 184 is not connected to drain terminal D of enhancement mode NMOS 182. Instead, TBU 184 is connected to a separate power source, not shown, so that it is separately powered from enhancement mode NMOS 182. In this embodiment the voltage drop $V_{IO}$ of apparatus 190 is equal to $V_{ds}$ of NMOS 182, or the voltage drop between drain and source terminals of NMOS 182, which is a function of gate bias voltage $V_n$ provided by charge pump 186 controlled by TBU 184. This embodiment has a similar advantage as the above-described separately powered embodiments in that it can operate effectively even when $I_{load}$ is zero.

Many other embodiments of the apparatus and method are possible. Therefore, the scope of the invention should be judged by the appended claims and their legal equivalents.

We claim:

1. An apparatus for transient blocking comprising:
  a) a transient blocking unit having at least one depletion mode n-channel device interconnected with at least one depletion mode p-channel device such that a transient alters a bias voltage $V_p$, of said depletion mode p-channel device and a bias voltage $V_n$ of said depletion mode n-channel device, whereby said depletion mode p-channel device and said depletion mode n-channel device mutually switch off to block said transient; and
  b) an enhancer circuit comprising a gate charge enhancer for applying an enhancement bias to a gate terminal of said at least one depletion mode n-channel device, thereby reducing a total resistance $R_{tot}$ of said apparatus, wherein said gate charge enhancer comprises a charge pump.

2. An apparatus for transient blocking comprising:
  a) a transient blocking unit having at least one depletion mode n-channel device interconnected with at least one depletion mode p-channel device such that a transient alters a bias voltage $V_p$ of said depletion mode p-channel device and a bias voltage $V_n$ of said depletion mode n-channel device, whereby said depletion mode p-channel device and said depletion mode n-channel device mutually switch off to block said transient; and
  b) an enhancement mode n-channel metal-oxide-silicon transistor connected to said transient blocking unit for reducing a total resistance $R_{tot}$ of said apparatus; and
  c) a gate bias device comprising a charge enhancer connected to said transient blocking unit and to a gate terminal of said enhancement mode n-channel metal-oxide-silicon transistor, wherein said gate charge enhancer further comprises a charge pump.

* * * * *